United States Patent
Yun et al.

(10) Patent No.: US 7,830,186 B2
(45) Date of Patent: Nov. 9, 2010

(54) DELAY LOCKED LOOP APPARATUS

(75) Inventors: Won Joo Yun, Seoul (KR); Hyun Woo Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 32 days.

(21) Appl. No.: 11/677,619

(22) Filed: Feb. 22, 2007

(65) Prior Publication Data

US 2007/0200604 A1    Aug. 30, 2007

(30) Foreign Application Priority Data

Feb. 22, 2006    (KR) .................. 10-2006-0016986

(51) Int. Cl.
*H03L 7/06* (2006.01)
(52) U.S. Cl. ............ 327/158; 327/149; 327/153; 327/161; 327/175
(58) Field of Classification Search ........... 327/33–38, 327/141, 144, 146–150, 152, 153, 155–159, 327/161–163, 172–176
See application file for complete search history.

(56) References Cited

U.S. PATENT DOCUMENTS

| | | | | |
|---|---|---|---|---|
| 6,677,792 B2 * | 1/2004 | Kwak | .......... | 327/158 |
| 6,956,418 B2 * | 10/2005 | Kwak et al. | .......... | 327/158 |
| 7,046,059 B2 * | 5/2006 | Kwak | .......... | 327/158 |
| 7,161,397 B2 * | 1/2007 | Lee et al. | .......... | 327/149 |
| 7,276,950 B2 * | 10/2007 | Monma et al. | .......... | 327/262 |
| 7,282,974 B2 * | 10/2007 | Lee | .......... | 327/158 |
| 7,385,428 B2 * | 6/2008 | Lee et al. | .......... | 327/149 |
| 7,598,783 B2 * | 10/2009 | Shin et al. | .......... | 327/158 |

(Continued)

FOREIGN PATENT DOCUMENTS

KR    1020030090122 A    11/2003

(Continued)

OTHER PUBLICATIONS

Bruno W. Garlepp, et al; "A Portable Digital DLL for High-Speed CMOS Interface Circuits", IEEE Journal of Solid-State Circuits, vol. 34, No. 5. May 1999, pp. 632-644.

(Continued)

*Primary Examiner*—Lincoln Donovan
*Assistant Examiner*—Patrick O'Neill
(74) *Attorney, Agent, or Firm*—Ladas & Parry LLP

(57) ABSTRACT

A delay locked loop (DLL) apparatus includes a first delay unit converting a reference clock into a rising clock. A second delay unit converts the reference clock into a falling clock, and a replica delay unit replica-delays the rising clock. A first phase detector compares the phases of the reference clock and the delayed rising clock to output a first detection signal corresponding to the compared phases. A controller synchronizes the rising edge of the rising clock with the rising edge of the reference clock according to the first detection signal of the first phase detector. A second phase detector compares the phases of the synchronized rising clock and the synchronization clock to output a second detection signal corresponding to the compared phases. The DLL apparatus compensates for a skew between an external clock and data and between external and internal clocks by employing a single replica delay unit.

7 Claims, 7 Drawing Sheets

U.S. PATENT DOCUMENTS

| | | | | |
|---|---|---|---|---|
| 2007/0182470 | A1* | 8/2007 | Heyne | 327/158 |
| 2008/0001642 | A1* | 1/2008 | Yun et al. | 327/161 |
| 2008/0174350 | A1* | 7/2008 | Shin | 327/158 |

FOREIGN PATENT DOCUMENTS

| | | |
|---|---|---|
| KR | 1020040064862 A | 7/2004 |
| KR | 20040095981 | 11/2004 |
| KR | 1020050040565 A | 5/2005 |

OTHER PUBLICATIONS

Kazuyuki Nakamura, et al; "A CMOS 50% Duty Cycle Repeater Using Complementary Phase Blending", 2000 Symposium on VLSI Circuits Digest of Technical Papers, pp. 48-49.

Jung-Bae Lee, et al; "Digitally-Controlled DLL and I/O Circuits for 500Mb/s/pin x16 DDR SDRAM", 2001 IEEE International Solid-State Circuits Conference.

Jong-Tae Kwak, et al; "A Low Cost High Performance Register-Controlled Digital DLL for 1 Gbps x32 DDR SDRAM", 2003 Symposium on VLSI Circuits Digest of Technical Papers, pp. 283-284.

Dong Uk Lee, et al; "A 2.5Gb/s/pin 256Mb GDDR3 SDRAM with Series Pipelined CAS Latency Control and Dual-Loop Digital DLL", 2006 IEEE International Solid-State Circuits Conference.

Hyun-Woo Lee, et al; "A Low Power High Performance Register-Controlled Digital DLL for 2Gbps x32 GDDR SDRAM", Asian Solid-State Circuits Conference, 2005 Nov. 1-3, 2005, pp. 401-404 Digital Object Identifier 10.1109/ASSCC.2005.251750.

Won-Joo Yun, et al; "A Low Power Digital DLL with Wide Locking Range for 3Gbps 512Mb GDDR3 SDRAM", Solid-State Circuits Conference, 2006, ASSCC 2006. IEEE Asian, Nov. 2006 pp. 323-326 Digital Object Identifier 10.1109/ASSCC.2006.357916.

* cited by examiner

DELAY LOCKED LOOP APPARATUS

TECHNICAL FIELD

The present invention relates to a delay locked loop apparatus, and more precisely to a delay locked loop apparatus implementing a circuit for compensating for a skew between an external clock and data or between external and internal clocks by employing a single replica delay unit.

BACKGROUND ART

In general, a delay locked loop (DLL) is used to perform synchronization between digital signals, such as between an external clock data or between external and internal clocks, in a semiconductor device, computer system or the like.

A conventional DLL apparatus related to the DLL has been disclosed in Korean Patent Publication No. 2004-95981.

The aforementioned conventional DLL apparatus employs two replica delay units.

That is, the conventional DLL apparatus generally includes a first loop generating a rising clock and a second loop generating a falling clock. The phase difference between a reference clock input through a clock buffer from each of the loops and a clock fed back through a replica delay unit is detected by a phase detector. A delay is corrected in accordance with the detected result, and a clock is locked in the corrected state.

In general, rising and falling clocks are applied to the two loops, and a digital DCC synchronizes the rising edges of the two clocks with phases opposite to each other.

FIG. 1 illustrates the concept of a conventional digital DCC.

If clock signals CLK, /CLK are input, a reference clock REF is generated using these clock signals CLK, /CLK. The reference clock REF is delayed in a first loop to be changed as a rising clock R_CLK and then delayed in a second loop to be changed as a falling clock F_CLK. Since the rising and falling clocks R_CLK and F_CLK are signals with opposite phases and different pulse widths (tck/2−□ and tck/2+□), the rising edges of the two clocks are set to each other, and the pulse widths of the two clocks is adjusted through half phase blending. Accordingly, an output clock CLK_OUT with a duty ratio of 50% is generated.

The aforementioned conventional DLL circuit uses a dual loop and has a configuration related to a replica delay for each loop. Further, both loops performs operations before a DCC operation is started. However, circuits related to the replica delay, such as a replica delay unit, a phase detector, a dummy digital circuit and a dummy load which are included in a loop (a loop corresponding to a falling clock), are not used after a clock is corrected and a DCC operation is then started.

Therefore, the conventional DLL circuit has a problem in that unnecessary circuits exist after an DCC operation is started, so that a current is unnecessarily consumed and a design area for the unnecessary circuits is more required.

Further, there is a problem in that an instantaneous current is consumed when a replica delay unit corresponding to a falling clock is changed in an off state, so that a jitter is produced and an additional locking time in accordance with the jitter is required.

DISCLOSURE OF THE INVENTION

It is an object of the present invention to provide a delay locked loop (DLL) apparatus for compensating for a skew between an external clock and data or between external and internal clocks using a loop with one replica delay unit.

It is another object of the present invention that one replica delay unit is applied, so that an amount of current consumption can be reduced and an area occupied by the replica delay unit can be decreased.

It is a further object of the present invention that one replica delay unit is applied, so that instantaneous current consumption can be prevented.

It is a still further object of the present invention that a rising clock is locked by comparing a reference clock with the rising clock in a first loop operation, and a falling clock is locked by comparing the rising clock with the falling clock in a second loop operation, a skew between clocks can be compensated.

It is a yet further object of the present invention to compensate for a duty ration in a DCC circuit after the rising and falling clock are locked.

To achieve these objects of the present invention, a data output control circuit according to a first embodiment of the present invention includes:.

According to an aspect of the present invention, there is provided a DLL apparatus, which includes: a delay means generating respective rising and falling clocks by delaying a reference clock, synchronizing a rising clock replica-delayed with the reference clock, and synchronizing the falling clock with the rising clock synchronized by the reference clock; a replica delay unit delaying the rising clock to provide the replica-delayed rising clock; a control means controlling the synchronization of the rising clock by comparing the phases of the reference clock and the replica-delayed rising clock, and controlling the synchronization of the falling clock by comparing the phases of the rising clock synchronized by the reference clock and the falling clock; and a DCC output unit outputting an output pulse by transmitting the rising clock of the delay means to the replica delay unit and adjusting the pulse width of the rising and falling clocks synchronized with each other in the delay means.

Here, the delay means may include: a first delay means generating the rising clock by delaying the reference clock, and synchronizing the rising clock replica delayed by the control of the control means with the reference clock; and a second delay means generating the falling clock by delaying the reference clock, and synchronizing the falling clock with the rising clock synchronized by the reference clock.

Further, the first delay means may include: a first coarse delay unit outputting the reference clock as first and second delay signals by delaying the reference clock with different delay times, wherein the first and second delay signals have a delay time difference in the delay time range of a unit cell; and a first fine delay unit generating the rising clock synchronized by the reference clock by complementarily adjusting the delay time difference between the first and second delay signals.

Furthermore, the second delay means may include: a second coarse delay unit outputting the reference clock as first and second delay signals by delaying the reference clock with different delay times, wherein the first and second delay signals have a delay time difference in the delay time range of a unit cell; and a second fine delay unit generating the falling clock synchronized by the reference clock by complementarily adjusting the delay time difference between the first and second delay signals.

In addition, the control means may include: a first phase detector detecting the phase difference between the reference clock and the replica-delayed rising clock to provide a first detecting signal; a second phase detector detecting the phase difference between the rising and falling clocks to provide a second detecting signal; a loop selector providing a selection signal for a loop which is currently performed with the first and second detection signals; an update enhancer phase detector detecting the phase difference between the reference clock and the replica-delayed rising clock to provide an enhanced detection signal; an update mode generator providing an update mode signal as the first detection signal, the second detection signal and the enhanced detection signal; and a controller performing a synchronization control for an object selected as the update mode signal and the selection signal.

Further, the DCC output unit may include: a DCC unit adjusting and outputting the pulse widths of the rising and falling clocks output from the delay means; and an output unit buffering and outputting a pulse output from the DCC unit.

Here, the DCC unit may provide an output to the replica delay unit.

According to another aspect of the present invention, there is provided a DLL apparatus, which includes: a rising clock synchronization means converting a reference clock into a rising clock, replica-delaying the rising clock, and then synchronizing the rising edge of the rising clock with the rising edge of the reference clock by adjusting the delay of the replica-delayed rising clock; a falling clock synchronization means converting the reference clock into a falling clock, and synchronizing the rising edge of the falling clock with the rising edge of the rising clock synchronized by the reference clock; a control means controlling the respective synchronization operations of the rising and falling clock synchronization means by comparing the phase differences between the reference clock and the replica-delayed rising clock and between the rising clock synchronized by the reference clock and the falling clock; and a DCC means generating an output clock using the rising and falling clocks respectively synchronized by the rising and falling clock synchronization means, and performing DCC.

Here, the rising clock synchronization means may include: a first delay means generating the rising clock by delaying the reference clock and synchronizing the replica-delayed rising clock with the reference clock; and a replica delay unit replica-delaying the rising clock provided as the DCC means.

Further, the control means may comprise: a first phase detector detecting the phase difference between the reference clock and the replica-delayed rising clock to provide a first detecting signal; a second phase detector detecting the phase difference between the rising and falling clocks to provide a second detecting signal; a loop selector providing a selection signal for a loop which is currently performed with the first and second detection signals; an update enhancer phase detector detecting the phase difference between the reference clock and the replica-delayed rising clock to provide an enhanced detection signal; an update mode generator providing an update mode signal as the first detection signal, the second detection signal and the enhanced detection signal; and a controller performing a synchronization control for an object selected as the update mode signal and the selection signal.

In addition, the DCC output unit may include: a DCC unit adjusting and outputting the pulse widths of the rising and falling clocks output from the delay means; and an output unit buffering and outputting a pulse output from the DCC unit.

Here, the DCC unit may provide an output to the replica delay unit.

BEST MODE FOR CARRYING OUT THE INVENTION

Hereinafter, preferred embodiments of the present invention will be described in detail with reference to the accompanying drawings.

Figure 1:
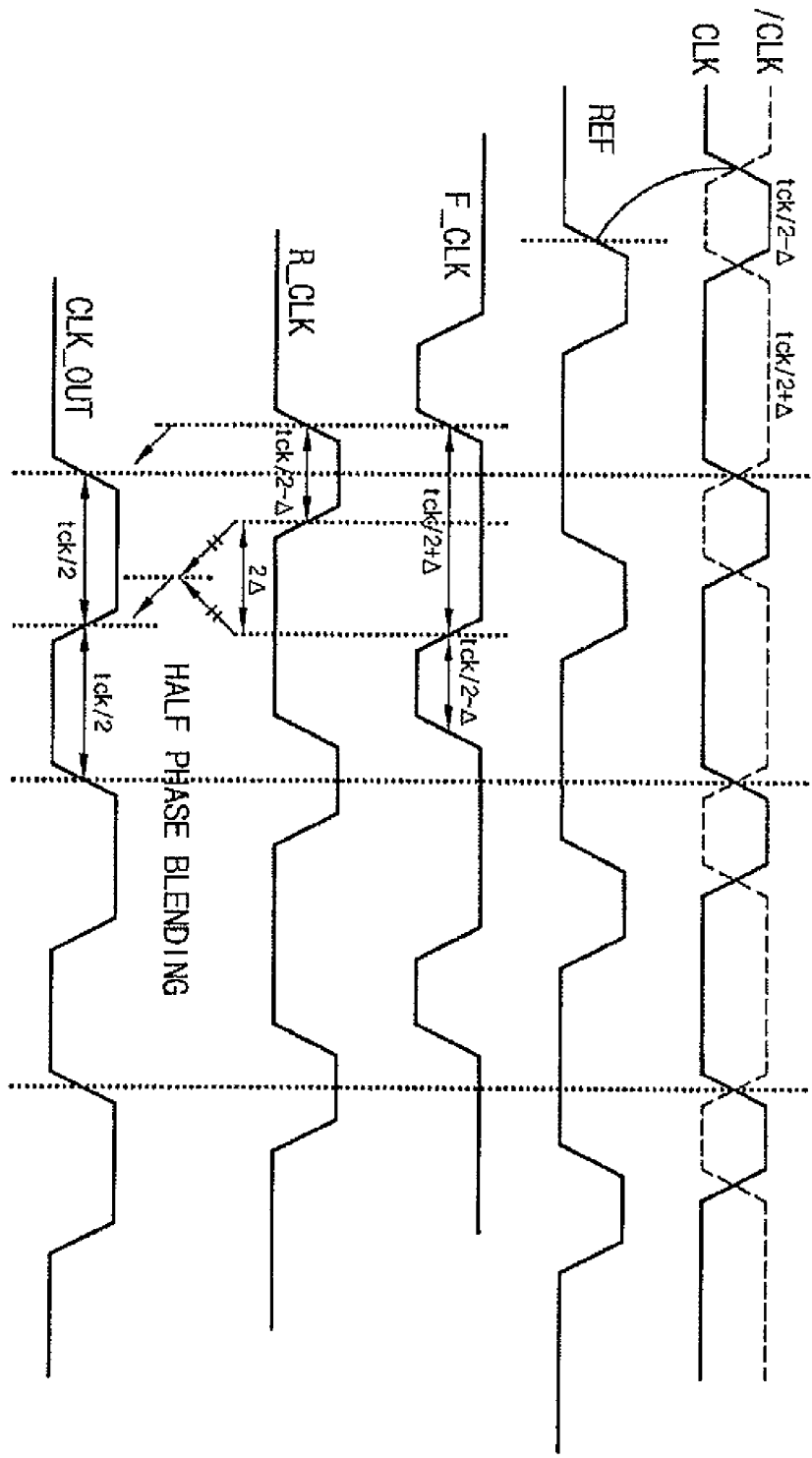
FIG. 1 is a waveform diagram illustrating the concept of a conventional digital DCC.
Figure 2:
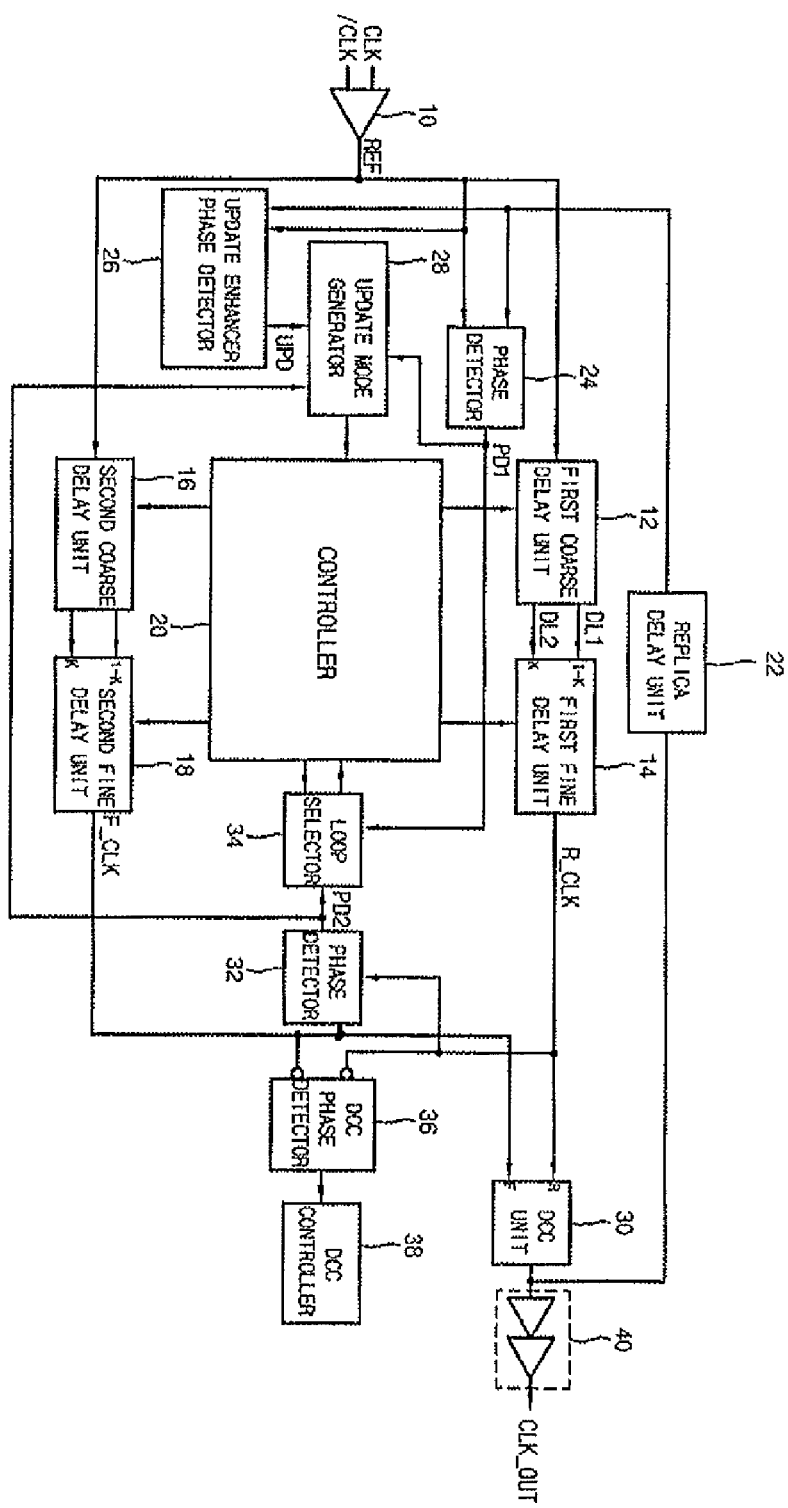
FIG. 2 is a block diagram showing a preferred embodiment of a delay locked loop apparatus according to the present invention.

FIG. 2 is a block diagram showing a preferred embodiment of a delay locked loop (DLL) apparatus according to the present invention. One replica delay unit is provided in FIG. 2.

Specifically, as shown in FIG. 2, the DLL apparatus includes a clock buffer 10 receiving input clocks CLK, /CLK to provide them as a reference clock REF; first coarse and fine delay units 12 and 14 constituting a first delay means sequentally delay the reference clock REF and converting it into a rising clock R_CLK; second coarse and fine delay units 16 and 18 constituting a second delay means sequentillay delaying the reference clock REF and converting it into a falling clock F_CLK; a controller 20 controlling the operations of the first and second coarse delay unit 12 and 16, and the first and second fine delay units 14 and 18; a replical delay unit 22; a phase detector 24 comparing the output of the replica delay unit 22 with the phase of the reference clock REF to output a detection signal PD1; an update enhancer phase detector 26 comparing the output of the replica delay unit 22 with the phase of the reference clock REF to output an enhanced detection signal UPD; and update mode generator 28 outputting an update mode signals, as the detection signals PD1 and PD2 (to be described layer) and the enhanced detection signal UPD, to the controller 20; a DCC unit 30 receiving the outputs (the rising and falling clocks R_CLK and F_CLK) of the first and second fine delay units 14 and 18 to adjust their pulse widths; a phase detector 32 comparing a phase difference between the outputs (the rising and falling clocks R_CLK and F_CLK) of the first and second fine delay units 14 and 18 to output the detection signal PD2; a loop selector 34 providing loop selection signals, as the detection signals PD1 and PD2 of the phase detectors 24 and 32, to the controller 20; and an output buffer 40 buffering the output of the DCC unit 30 to output it as an output clock CLK_OUT.

In the aforementioned FIG. 2, a rising clock R_CLK is primarily generated by the first coarse and fine delay units 12 and 14. The rising clock R_CLK is fed back by the replica delay unit 22 through the DCC unit 30. The phase of the rising clock R_CLK fed back by the replica delay unit 22 is compared with the phase of a reference clock REF in the phase detector 24 and the update enhancer phase detector 26. The compared result is detected as a detection signal PD1 and an enhanced detection signal UPD in the phase detector 24 and the update enhancer phase detector 26. Each of the detection signal PD1 and the enhanced detection signal UPD has a logical high or low value, which will be described later, and output to the update mode generator 28.

Here, the update enhancer phase detector 26 provides to the update mode generator 28 the enhanced detection signal UPD for rapidly controlling when a phase difference between the reference clock REF and the rising clock R_CLK is large. The update mode generator 28 provides to the controller 20 an update mode control signal for controlling the phase of the rising clock R_CLK in accordance with the detection signal PD1 and the enhanced detection signal UPD. The controller 20 controls the delays of the respective first coarse and fine delay units 12 and 14 in accordance with the update mode control signal such that the rising clock R_CLK is locked.

Through the operation, the phase difference between the rising edges of the rising clock R_CLK and the reference clock REF is adjusted to have a large value by the first coarse delay unit 12, and finely adjusted by the second coarse delay unit 16. If the phase difference between both the rising edges is large, the state of the large phase difference is detected by the update enhancer phase detector 26. Accordingly, the update mode generator 28 provides an update mode control signal to the controller 20 to have information on the state, and the first coarse delay unit 12 controls the rising clock R_CLK to be delayed by a large time.

As described above, if the locking of the rising clock R_CLK has been completed, the phase detector 32 detects a phase difference between the rising and falling clocks R_CLK and F_CLK. The phase detector 32 compares the phase difference between the rising and falling clocks R_CLK and F_CLK to provide a detection signal PD2 corresponding to the phase difference to the loop selector 34 and the update mode generator 28.

The loop selector 34 provides a loop selection signal to the controller 20 to control the second coarse and fine delay units 16 and 18. The controller 20 controls the delay state of each of the second coarse and fine delay units 16 and 18 in accordance with the update mode control signal of the update mode generator 28, which has received the detection signal PD2, such that the delay of the falling clock F_CLK is adjusted.

As as described above, as the delay of the falling clock F_CLK is controlled, the edge of the falling clock F_CLK is synchronized with that of the rising clock R_CLK.

If the rising clock R_CLK is synchronized with the reference clock as reference and the falling clock F_CLK is then synchronized with the rising clock R_CLK as reference, as described above, the DCC unit 30 sychronizes the falling clock F_CLK with the rising clock R_CLK to perform a DCC operation.

At this time, the control of the DCC unit 30 is performed by a DCC phase detector 36 comparing the inverted phases of the respective rising and falling clocks R_CLK and F_CLK to provide a detection signal for the inverted phases, and a DCC controller 38 generating a control signal in accordance with the detection signal provided from the DCC phase detector 36. The output of the DCC unit 30 is output as an output clock CLK_OUT through the output buffer 40.

Figure 3:
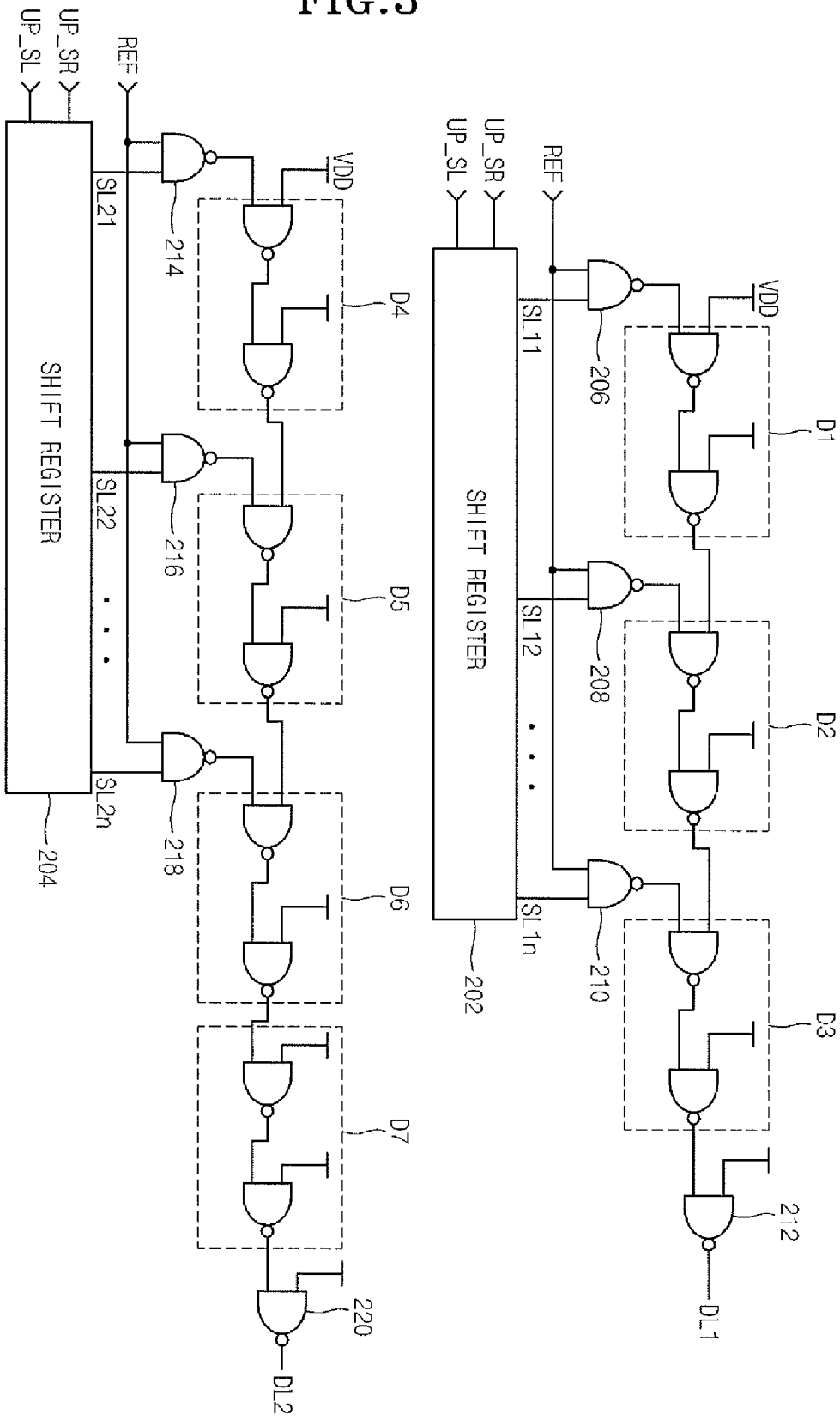
FIG. 3 is a circuit diagram illustrating first and second coarse delay units of FIG. 2.

The aforementioned first and second coarse delay units 12 and 16 are configured as shown in FIG. 3.

Specifically, the first and second coarse delay units 12 and 16 are divided into an upper delay part outputting a reference clock REF as a first delay signal DL1 and a lower delay part outputting a reference clock REF as a second delay signal DL2 delayed more by the time corresponding to the delay time of a unit cell than the first delay time DL1.

The upper delay part includes a shift register 202, a plurality of NAND gates 206, 208 and 210, a plurality of unit cells D1, D2 and D3, and a NAND gate 212 outputting a delayed signal.

In the aforementioned configuration, the shift register 202 receives shift right and left control signals UP_SR and UP_SL provided from the controller 20 to output shift signals SL11, SL12, ..., SL1n.

Each of the plurality of NAND gates 206, 208 and 210 receives a reference clock REF and one of the shift signals SL11, SL12, ..., SL1n input from the shift register 202, and performs a NAND operation with respect thereto. Then, each of the plurality of NAND gates 206, 208 and 210 provides the NAND-operated signal to each of the unit cells D1, D2 and D3.

The unit cells D1, D2 and D3 have a delay chain structure in which a second NAND gate receives an output of a first NAND gate enabled by a signal applied from each of the NAND gates 206, 208 and 210, and the second NAND gate inverts the output of the first NAND gate to output it.

Further, a delay signal output from the unit cell D3 that is a final terminal is inverted through the NAND gate 212 of which one terminal is fixed with a high level to be output as a first delay signal DL1.

In addition, the lower delay part includes a shift register 204 receiving shift right and left control signals UP_SR and UP_SL provided from the controller and outputting shift signals SL11, SL12, ..., SL1n; a plurality of NAND gates 214, 216 and 218 each performing a NAND operation with respect to a reference clock and an output of the shift register 204 and then outputting the NAND-operated signal; and a chain of unit cells D4, D5 and D6 respectively enabled by signals output from the NAND gates 214, 216 and 218. Further, the lower delay part further includes a unit cell D7 between the unit cell D6 and a NAND gate 220 outputting a second delay signal DL2.

In the first and second coarse delay units 12 and 16 provided with the aforementioned configuration, a delay is controlled as a unit of the delay of a unit cell. The reason why the first and second delay signals DL1 and DL2 of the upper and lower delay parts have a delay time difference by the delay time of a unit delay cell in the first and second coarse delay units 12 and 16 is that the first and second fine delay units 14 and 18 controls a delay in the delay time range of the unit cell.

Figure 4:
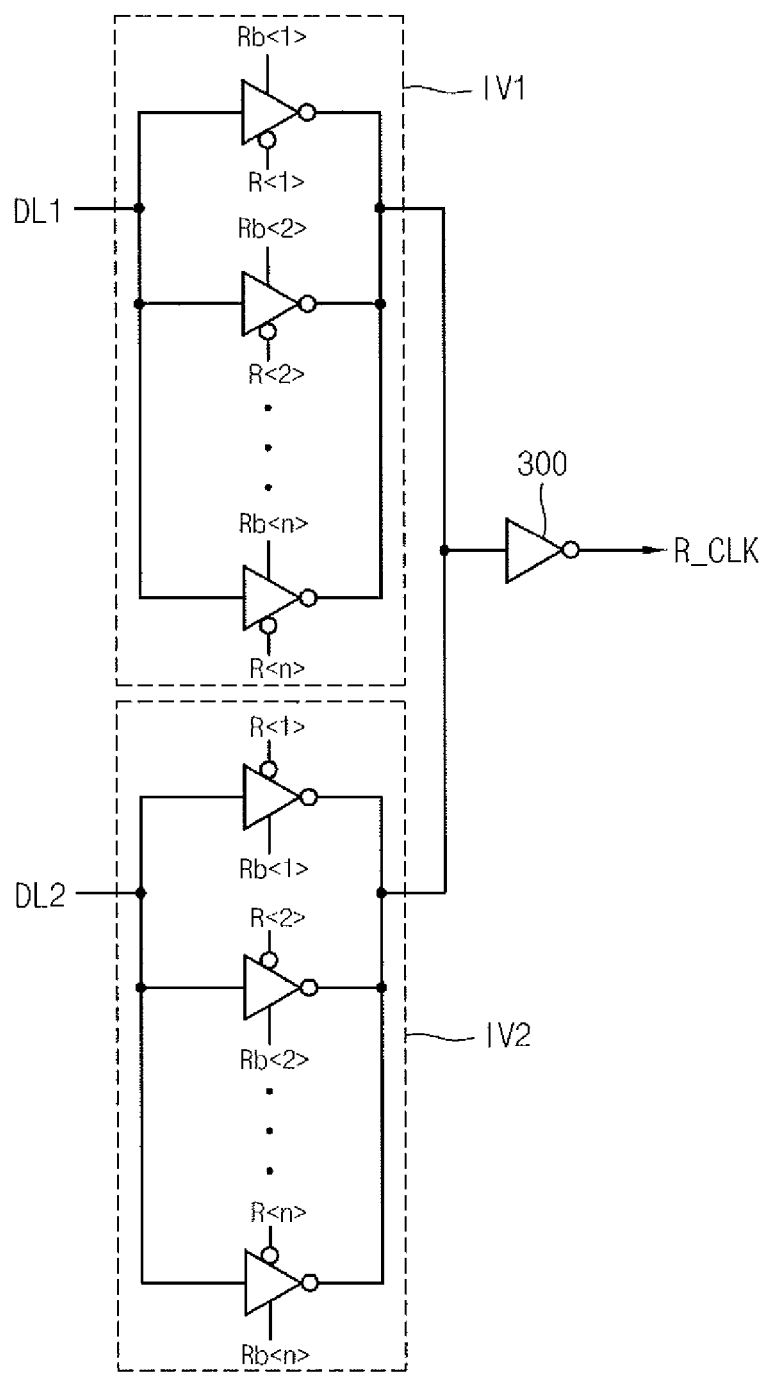
FIG. 4 is a circuit diagram illustrating first and second fine delay units of FIG. 2.

Referring to FIG. 4, the first and second fine delay units 14 and 18 include a first inverter group IV1 having a plurality of inverters connected in parallel to one another, to which the first delay signal DL1 is input, a second inverter group IV2 having a plurality of inverters connected in parallel to one another, to which the second delay signal DL2 is input, and an inverter 300 having the common outputs of the first and second inverter groups IV1 and IV2 as a common input. Here, the number of inverters included in the first inverter group IV1 is the same as that of inverters included in the second inverter group IV2. Each of the inverters is driven in accordance with a complemenatary control signal provided from the controller 20. The control signal is complementarily input to the first and second inverter groups IV1 and IV2.

That is, if a certain number of inverters are selected to be driven in the first inverter group IV1, the number of inverters, in which the number of inverters selected from the first inverter group IV1 is substracted from the total number of inverters, is selected to be driven in the second inverter group IV2. Thus, the delay time of a unit cell is divided by the number n belonging to each group of the first and second fine delay units 14 and 18, and the delay time is adjusted as a unit of the partitiond delay time by corresponding to the selected number.

Meanwhile, the update enhancer phase detector 26 of FIG. 5a compares a clock FBCLK fed back by the replica delay unit 22 with a referece clock REF, and outputs a signal corresponding to the compared result.

Figure 5:
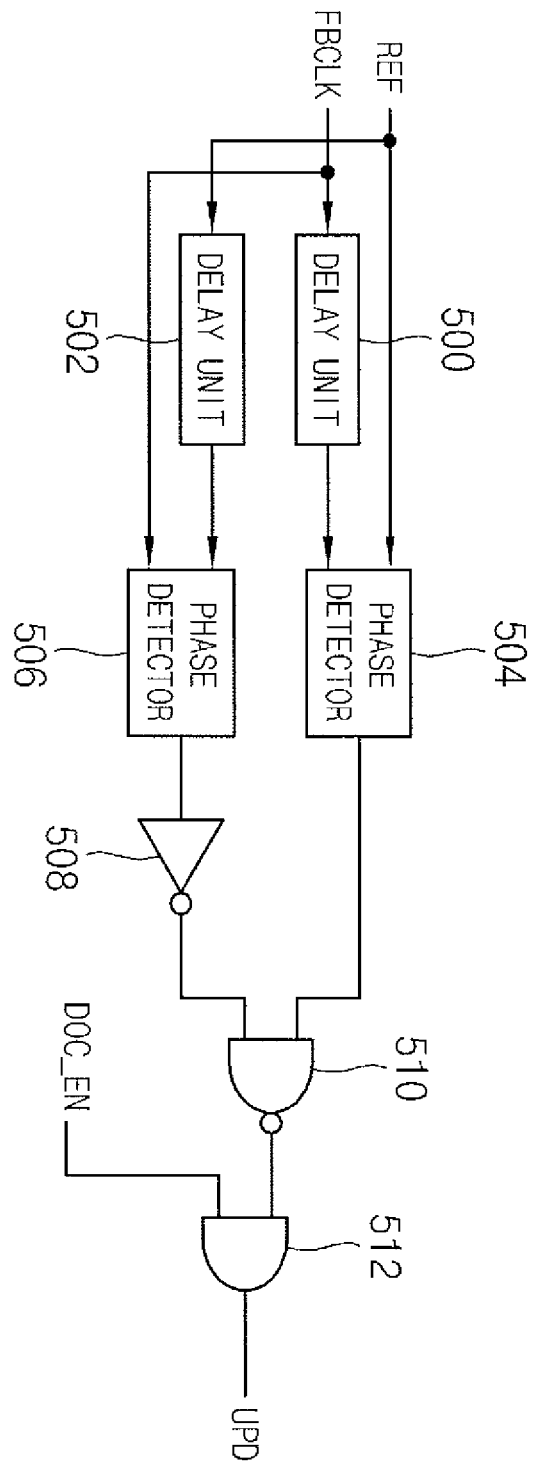
FIG. 5 is a circuit diagram illustrating an update enhancer phase detector of FIG. 2.

In FIG. 5, the update enhancer phase detector 26 includes delay units 500 and 502 delaying the clock FBCLK delayed and then fed back in the replica delay unit 22 at different times; a phase detector 504 comparing the delay clock of the delay unit 500 with the phase the reference clock REF; a phase detector 506 comparing the delay clock of the delay unit 502 with the phase the reference clock REF; an inverter 508 inverting the output of the phase detector 506; a NAND gate 510 performing a NAND operation with respect to the outputs of the phase detector 504 and the inverter 508; and an AND gate 512 selectively outputting the output of the NAND gate 510 as an enhanced detection signal UPD in accordance with a DCC enable signal.

Here, in a case where the rising edge of a clock FBCLK fed back is positioned beyond a certain range with the rising edge of the reference clock REF as reference, upper and lower limit delay times for detecting the rising edge of the clock FBCLK are respectively applied to the delay units 500 and 502.

Through the aforementioned configuration, the output of the NAND gate 510 is determined in the state that a case where the rising edge of the fed-back clock FBCLK is positioned in a certain range with the rising edge of the reference clock REF and an opposite case can be divided. Accordingly, the enhanced detection signal UPD is determined and then output.

Figure 6:
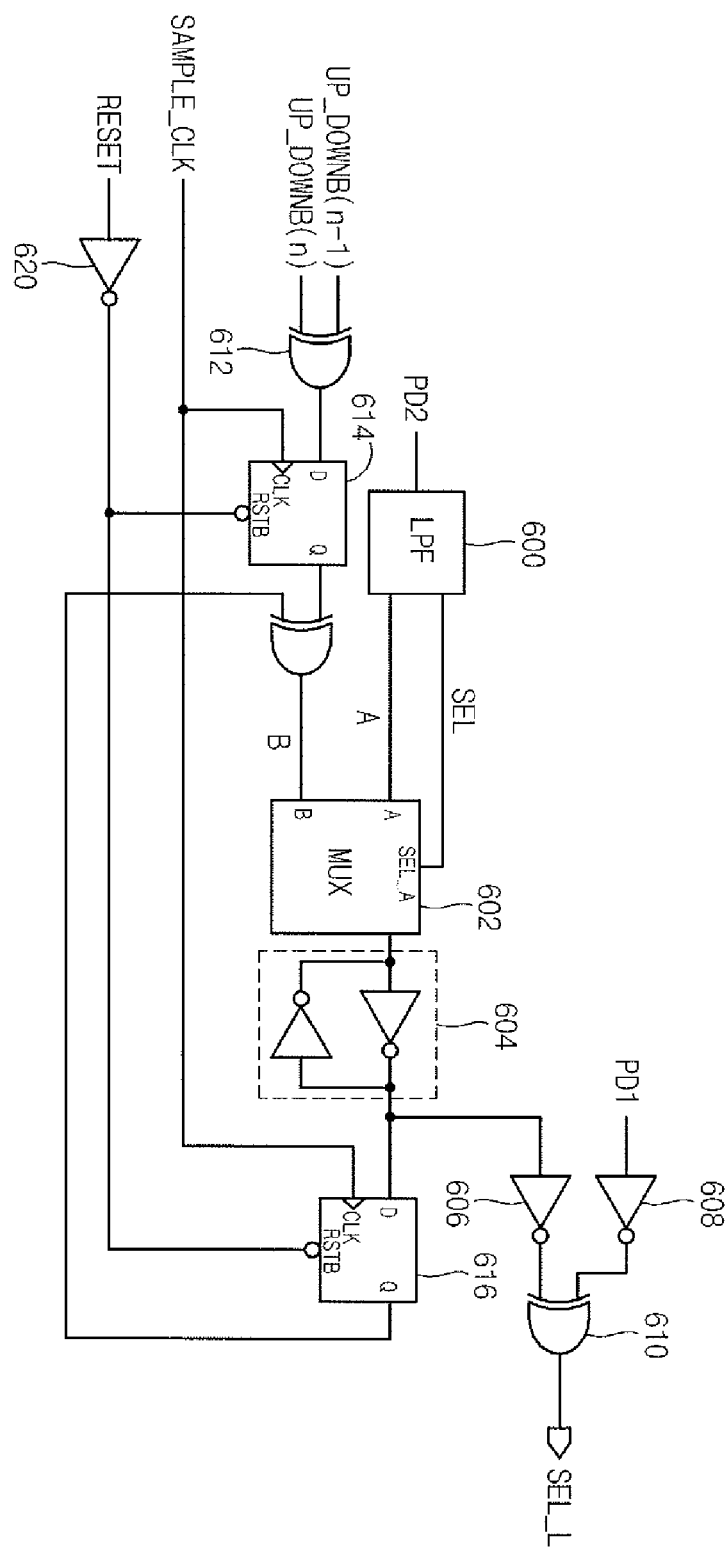
FIG. 6 is a circuit diagram illustrating a loop selector of FIG. 2.

Further, a detailed circuit of the loop selector 34 is illustrated in FIG. 6.

A detection signal PD2 of the phase detector 32 is input to a low pass filter (LPF) 600. In a case where the detection signal PD2 corresponds to a signal in which a phase difference is detected, the LPF 600 outputs a selection signal SEL to the control output A of the LPF 600 to be selected. In opposite case, a multiplexer 602 is set to select the output B of an exclusive OR 618

The output of the multiplexer 602 is latched by a latch 604. Signals in which the detection signal PD1 and the signal of the latch 604 are respectively inverted by inverters 608 and 606 are logically operated by an exclusive OR 610 and then output as a loop selection signal SEL_L.

Meanwhile, in a case where a phase control is repeatedly performed in the same direction in the second coarse delay unit 14 and the second fine delay unit 18, the previous control signal up_downb(n−1) and the current control signal up_downb(n) with respect to the phase control is logically operated by an exclusive OR to be provided to an input terminal of a D flip-flop 614. The output of the D flip-flop 614 is applied to an exclusive OR 618. Further, the exclusive OR 618 logicacall operates the output of a D flip-flop 616 output by inverting the output of the D flip-flop 614 and the output latched by the latch 604 to provide the logically operated output to the input B of the multiplexer 602.

Accordingly, the loop selector 34 provides a selection signal such that the controller 20 can select a loop (the first coarse and fine delay units 12 and 14, or the second coarse and fine delay units 16 and 18), in which the delay is currently performed.

Figure 7:
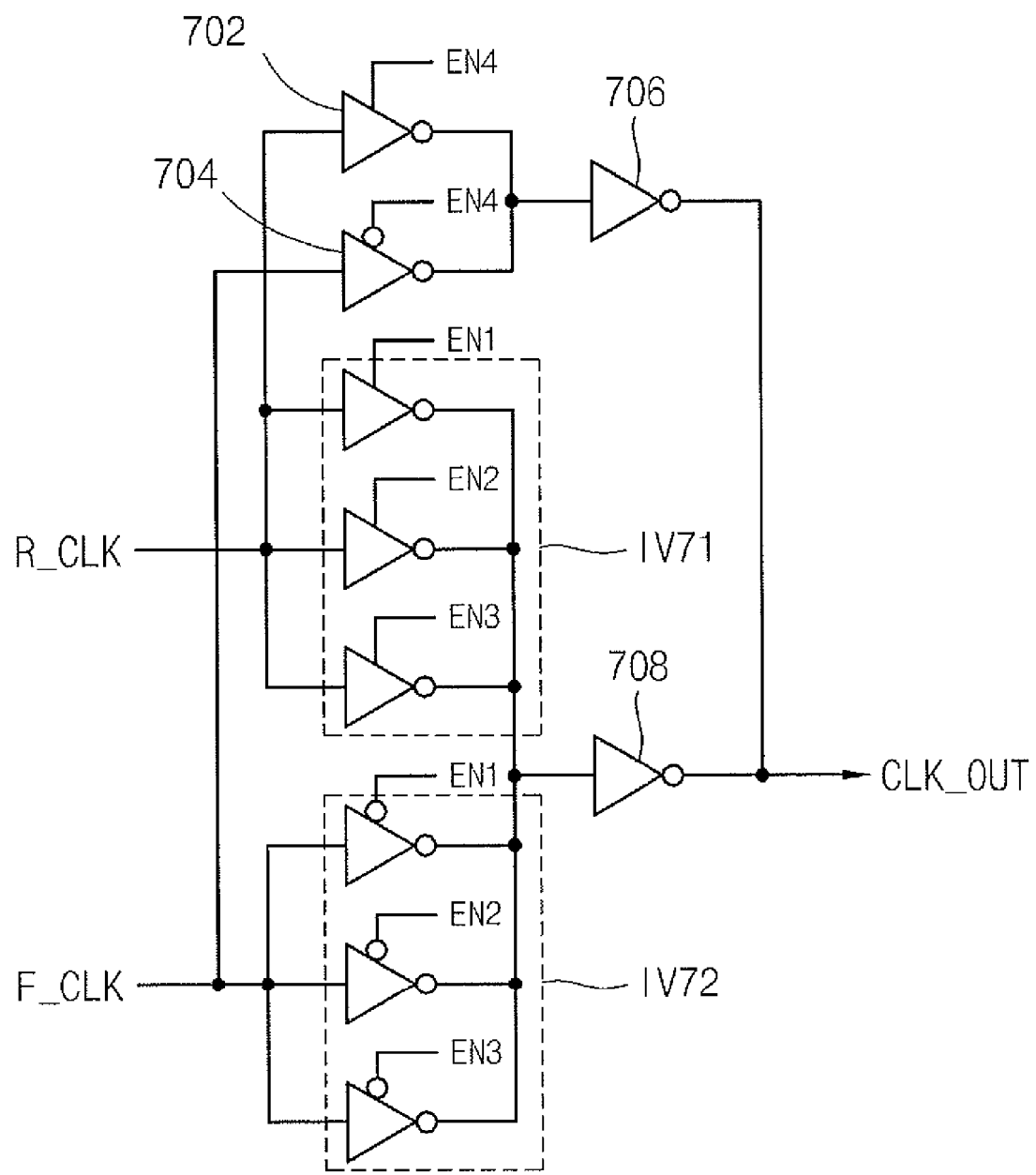
FIG. 7 is a circuit diagram illustrating a DCC unit of FIG. 2.

Meanwhile, the DCC unit 30 may be configured as illustrated in FIG. 7. The DCC unit 30 includes an inverter group IV71 in which a rising clock R_CLK is applied to inverters connected in parallel to one another; an inverter group IV72 in which a falling clock F_CLK is applied to inverters connected in parallel to one another; an inverter 702 having the rising clock R_CLK applied thereto; an inverter 704 having the falling clock F_CLK applied thereto; an inverter 706 having the outputs of the inverters 702 and 704 commonly applied thereto; and an inverter 708 having the outputs of the inverter groups IV71 and IV72 commonly applied thereto. The outputs of the inverters 706 and 708 is put together and then output as an output clock CLK_OUT. Here, the inverter groups IV71 and IV72 are configured to be complementarily operated by enable signals EN1, EN2 and EN3. The inverters 702 and 704 are also configured to be complementarily operated by an enable signal EN4 provided from the DCC controller 38.

That is, the DCC unit 30 functions to adjust a pulse width by performing half blending with respect to the falling edges of rising and falling clocks R_CLK and F_CLK, which is accomplished through half blending between the inverter groups IV71 and IV72, and between the inverters 704 and 702. Here, the inverter groups IV71 and IV72 adjust the pulse width, and the inverters 702 and 704 play an auxiliary role.

INDUSTRIAL APPLICABILITY

According to the present invention, a DLL apparatus for compensating for a skew between an external clock and data or between external and internal clocks can be implemented.

Therefore, the present invention has an advantage in that unnecessary current consumption can be reduced as compared with a conventional apparatus using a dual replica delay unit, and as an area occupied by a replica delay unit is reduced, an area can be secured by the reduced area.

Further, the present invention has an advantage in that instantaneous current consumption is prevented by using a single replica delay unit, so that the occurrence of a jitter and an additional locking time for solving the jitter are unnecessary.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. A delay locked loop (DLL) apparatus, comprising:
a delay means generating respective rising and falling clocks by delaying a reference clock, synchronizing a rising clock replica-delayed with the reference clock, and synchronizing the falling clock with the rising clock synchronized by the reference clock;
only one replica delay unit delaying the rising clock to provide the replica-delayed rising clock;
a control means controlling the synchronization of the rising clock by comparing the phases of the reference clock and the replica-delayed rising clock, and controlling the synchronization of the falling clock by comparing the phases of the rising clock synchronized by the reference clock and the falling clock,
wherein the control means comprises:
a first phase detector detecting the phase difference between the reference clock and the replica-delayed rising clock to provide a first detecting signal to an update mode generator;
a second phase detector detecting the phase difference between the rising and falling clocks to provide a second detecting signal to the update mode generator;
an update enhancer phase detector detecting the phase difference between the reference clock and the replica-delayed rising clock to provide an enhanced detection signal to the update mode generator;

the update mode generator providing an update mode signal as the first detection signal, the second detection signal and the enhanced detection signal; and a DCC output unit outputting an output pulse by transmitting the rising clock of the delay means to the replica delay unit and adjusting the pulse width of the rising and falling clocks synchronized with each other in the delay means.

2. The DLL apparatus as set forth in claim 1, wherein the delay means comprises:

a first delay means generating the rising clock by delaying the reference clock, and synchronizing the rising clock replica delayed by the control of the control means with the reference clock; and a second delay means generating the falling clock by delaying the reference clock, and synchronizing the falling clock with the rising clock synchronized by the reference clock.

3. The DLL apparatus as set forth in claim 2, wherein the first delay means comprises:

a first coarse delay unit outputting the reference clock as first and second delay signals by delaying the reference clock with different delay times, wherein the first and second delay signals have a delay time difference in the delay time range of a unit cell; and a first fine delay unit generating the rising clock synchronized by the reference clock by complementarily adjusting the delay time difference between the first and second delay signals.

4. The DLL apparatus as set forth in claim 2, wherein the second delay means comprises:

a second coarse delay unit outputting the reference clock as first and second delay signals by delaying the reference clock with different delay times, wherein the first and second delay signals have a delay time difference in the delay time range of a unit cell; and a second fine delay unit generating the falling clock synchronized by the reference clock by complementarily adjusting the delay time difference between the first and second delay signals.

5. The DLL apparatus as set forth in claim 1, wherein the control means further comprises:

a loop selector providing a selection signal for a loop which is currently performed with the first and second detection signals; and a controller performing a synchronization control for an object selected as the update mode signal and the selection signal.

6. The DLL apparatus as set forth in claim 1, wherein the DCC output unit comprises:

a DCC unit adjusting and outputting the pulse widths of the rising and falling clocks output from the delay means; and an output unit buffering and outputting a pulse output from the DCC unit.

7. The DLL apparatus as set forth in claim 6, wherein the DCC unit provides an output to the replica delay unit.

* * * * *